(12) United States Patent
Whitehouse et al.

(10) Patent No.: US 11,927,617 B2
(45) Date of Patent: Mar. 12, 2024

(54) APPARATUS FOR MONITORING A CONDITION OF AN ELECTRICAL POWER TRANSMISSION MEDIUM

(71) Applicant: GENERAL ELECTRIC TECHNOLOGY GMBH, Baden (CH)

(72) Inventors: Robert Stephen Whitehouse, Stafford (GB); Rosemary King, Stafford (GB)

(73) Assignee: General Electric Technology GMBH, Baden (CH)

( * ) Notice: Subject to any disclaimer, the term of this patent is extended or adjusted under 35 U.S.C. 154(b) by 0 days.

(21) Appl. No.: 17/267,841

(22) PCT Filed: Aug. 13, 2019

(86) PCT No.: PCT/EP2019/071741
§ 371 (c)(1),
(2) Date: Feb. 11, 2021

(87) PCT Pub. No.: WO2020/035501
PCT Pub. Date: Feb. 20, 2020

(65) Prior Publication Data
US 2021/0231725 A1    Jul. 29, 2021

(30) Foreign Application Priority Data
Aug. 16, 2018   (EP) .................................... 18189409

(51) Int. Cl.
*G01R 31/11* (2006.01)
*G01R 27/06* (2006.01)
(52) U.S. Cl.
CPC .............. *G01R 31/11* (2013.01); *G01R 27/06* (2013.01)
(58) Field of Classification Search
CPC ........ G01R 31/11; G01R 27/06; G01R 29/08; G01R 29/085; G01R 31/00; G01R 31/08;
(Continued)

(56) References Cited

U.S. PATENT DOCUMENTS

2005/0057259 A1*  3/2005  Hornsby .............. G01R 31/086
                                                         340/657
2011/0304340 A1   12/2011  Hall et al.
(Continued)

FOREIGN PATENT DOCUMENTS

CN     104283610 A  *  1/2015
JP     2006-220460 A     8/2006
(Continued)

OTHER PUBLICATIONS

Ramphal, M., et al., "Using The Time Domain Reflectometer To Check For Locate A Fault", Proceedings of the Third International Candu Maintenance Conference (Nov. 19, 1995), XP002787889, Retrieved from the Internet: URL:https://inis.iaea.org/collection/NCLCollectionStore/_Public/29/054/29054772.pdf [retrieved on Jan. 14, 2019].

*Primary Examiner* — Son T Le
(74) *Attorney, Agent, or Firm* — Eversheds Sutherland (US) LLP

(57) ABSTRACT

There is provided an apparatus (20) for monitoring a condition of an electrical power transmission medium (22), the apparatus (20) comprising: a signal source (24) for transmitting a signal (30) to travel along the electrical power transmission medium (22); and a monitoring device (26) configured to detect one or more reflected signals (34) in the electrical power transmission medium (22), wherein the monitoring device (24) is configured to use the or each detected reflected signal (34) to determine a change in capacitance of the electrical power transmission medium (22).

16 Claims, 6 Drawing Sheets

(58) Field of Classification Search
CPC .... G01R 27/16; G01R 27/26; G01R 27/2605; G01R 31/085
See application file for complete search history.

(56) References Cited

U.S. PATENT DOCUMENTS

| | | |
|---|---|---|
| 2015/0160283 A1 | 6/2015 | Hall et al. |
| 2019/0293706 A1* | 9/2019 | Sohn .................. G01R 23/16 |
| 2020/0003628 A1 | 1/2020 | Preston et al. |

FOREIGN PATENT DOCUMENTS

| | | | |
|---|---|---|---|
| KR | 101570506 B1 * | 11/2015 | ............. G01R 27/06 |
| WO | 2010/116319 A2 | 10/2010 | |

* cited by examiner

APPARATUS FOR MONITORING A CONDITION OF AN ELECTRICAL POWER TRANSMISSION MEDIUM

CROSS-REFERENCE TO RELATED APPLICATIONS

This application is a U.S. National Stage Application under 35 U.S.C. 371 and claims the priority benefit of International Application No. PCT/EP2019/071741, filed Aug. 13, 2019, which claims priority to European Application No. 18189409.8, filed Aug. 16, 2018, which are both incorporated herein by reference.

This invention relates to an apparatus and method for monitoring a condition of an electrical power transmission medium.

In power transmission systems, electrical power is typically transmitted via overhead lines, under-sea cables and/or underground cables.

According to a first aspect of the invention, there is provided an apparatus for monitoring a condition of an electrical power transmission medium, the apparatus comprising: a signal source for transmitting a signal to travel along the electrical power transmission medium; and a monitoring device configured to detect one or more reflected signals in the electrical power transmission medium, wherein the monitoring device is configured to use the or each detected reflected signal to determine a change in capacitance of the electrical power transmission medium.

The capacitance of the electrical power transmission medium can change over its lifetime for a variety of reasons. For example, the capacitance of the electrical power transmission medium may change due to ageing, such as thermal ageing and high voltage ageing, especially at higher frequencies. Such a change could result in the condition, and therefore the performance, of the electrical power transmission medium deviating from acceptable operating ranges.

The inventor has found that time domain reflectometry (TDR) can be used to monitor and determine the change in capacitance of the electrical power transmission medium, which affects the characteristic impedance (otherwise known as surge impedance) and propagation speed or velocity of the electrical power transmission medium. By successfully determining the change in capacitance of the electrical power transmission medium, it is possible to accurately monitor the condition of the electrical power transmission medium to allow an operator to make any necessary adjustments to maintain its performance within target operating ranges and identify any need to conduct maintenance or repair.

The invention is particularly useful and cost-effective for monitoring the condition of a long electrical power transmission medium, which may be tens or hundreds of kilometres in length. This is because the use of TDR means that the apparatus only needs to be connected to one end of the electrical power transmission medium in order to perform the function of determining the change in capacitance of the electrical power transmission medium, as opposed to having multiple apparatus connected at various points along the length of the electrical power transmission medium.

Furthermore, the invention is readily applicable to any type of electrical power transmission medium used in any type of power transmission system regardless of topology.

In order to determine the change in capacitance of the electrical power transmission medium, the monitoring device may be configured to use an arrival time of the or each detected reflected signal and/or use a magnitude or amplitude of the or each detected reflected signal.

There are different ways of configuring the apparatus of the invention in order to obtain a wide range of information about the change in capacitance of the electrical power transmission medium and thereby provide more specific details about the condition of the electrical power transmission medium.

In embodiments of the invention, the monitoring device may be configured to use the or each detected reflected signal to determine the change in capacitance of the electrical power transmission medium with a length of the electrical power transmission medium.

Configuration of the monitoring device in the above manner enables determination of the variation of the change in capacitance across the length of the electrical power transmission medium.

It may be the case that the change in capacitance affects only a section, instead of the whole, of the electrical power transmission medium, which means that it would be desirable to obtain information about the affected section.

The use of TDR not only enables the configuration of the apparatus of the invention to obtain information about the change in capacitance of the affected section, but also enables the information to be obtained without being in the vicinity of the affected section. This is useful for when the affected section is in a remote location.

In further embodiments of the invention, the monitoring device may be configured to use the or each detected reflected signal to determine a location of a section of the electrical power transmission medium that corresponds to the change in capacitance of the electrical power transmission medium.

Configuration of the monitoring device in the above manner is useful for remotely pinpointing the location of the affected section.

The monitoring device may be configured to use a reference reflected signal that is based on a reference location in the electrical power transmission medium, and the monitoring device may be configured to compare the or each detected reflected signal with the reference reflected signal to determine the location of the section of the electrical power transmission medium that corresponds to the change in capacitance of the electrical power transmission medium. This enables a more accurate determination of the location of the affected section.

In still further embodiments of the invention, the monitoring device may be configured to use the or each detected reflected signal to determine a length of a section of the electrical power transmission medium that corresponds to the change in capacitance of the electrical power transmission medium.

Configuration of the monitoring device in the above manner enables remote determination of the length of the affected section.

The monitoring device may be configured to use a reference reflected signal that is based on a reference location in the electrical power transmission medium, and the monitoring device may be configured to compare the or each detected reflected signal with the reference reflected signal to determine a length of the section of the electrical power transmission medium that corresponds to the change in capacitance of the electrical power transmission medium. This enables a more accurate determination of the length of the affected section.

Preferably the reference location in the electrical power transmission medium is the location of a discontinuity in characteristic impedance in the electrical power transmission medium. The discontinuity in characteristic impedance may be, for example, a joint, a junction or a terminal in the electrical power transmission medium.

The monitoring device may be configured to use the or each detected reflected signal to determine the change in capacitance of the electrical power transmission medium with time. This enables the acquisition of time-varying information about the change in capacitance of the electrical power transmission medium. Such time-varying information can be used to not only schedule any necessary adjustments, maintenance or repair of the electrical power transmission medium in advance, but also predict the future change in condition of another similar electrical power transmission medium.

In a preferred embodiment of the invention, the electrical power transmission medium may be, but is not limited to, an electrical power transmission line or cable. Examples include, but are not limited to, an overhead line, an under-sea cable and/or an underground cable.

In each of the foregoing embodiments, the apparatus may include an electrical circuit, a processor and/or a computing device configured to use the or each detected reflected signal to determine the change in capacitance of the electrical power transmission medium. The apparatus may further include software or computer instructions to implement an algorithm for using the or each detected reflected signal to determine the change in capacitance of the electrical power transmission medium.

According to a second aspect of the invention, there is provided a method for monitoring a condition of an electrical power transmission medium, the method comprising the steps of: transmitting a signal to travel along the electrical power transmission medium; detecting one or more reflected signals in the electrical power transmission medium; and using the or each detected reflected signal to determine a change in capacitance of the electrical power transmission medium.

The features and advantages of the apparatus of the first aspect of the invention and its embodiments apply mutatis mutandis to the method of the second aspect of the invention and its embodiments.

The method of the invention may include the step of using an arrival time of the or each detected reflected signal to determine the change in capacitance of the electrical power transmission medium.

The method of the invention may include the step of using a magnitude or amplitude of the or each detected reflected signal to determine the change in capacitance of the electrical power transmission medium.

The method of the invention may include the step of using the or each detected reflected signal to determine the change in capacitance of the electrical power transmission medium with a length of the electrical power transmission medium.

The method of the invention may include the step of using the or each detected reflected signal to determine a location of a section of the electrical power transmission medium that corresponds to the change in capacitance of the electrical power transmission medium.

The method of the invention may include the steps of: using a reference reflected signal that is based on a reference location in the electrical power transmission medium; and comparing the or each detected reflected signal with the reference reflected signal to determine the location of the section of the electrical power transmission medium that corresponds to the change in capacitance of the electrical power transmission medium.

The method of the invention may include the step of using the or each detected reflected signal to determine a length of a section of the electrical power transmission medium that corresponds to the change in capacitance of the electrical power transmission medium.

The method of the invention may include the steps of: using a reference reflected signal that is based on a reference location in the electrical power transmission medium; and comparing the or each detected reflected signal with the reference reflected signal to determine a length of the section of the electrical power transmission medium that corresponds to the change in capacitance of the electrical power transmission medium.

In the method of the invention, the reference location in the electrical power transmission medium is preferably the location of a discontinuity in characteristic impedance in the electrical power transmission medium.

The method of the invention may include the step of using the or each detected reflected signal to determine the change in capacitance of the electrical power transmission medium with time.

In the method of the invention, the electrical power transmission medium may be, but is not limited to, an electrical power transmission line or cable. As stated above, examples include, but are not limited to, an overhead line, an under-sea cable and/or an underground cable.

A preferred embodiment of the invention will now be described, by way of a non-limiting example, with reference to the accompanying drawings in which.

The following embodiment of the invention is described in relation to an electrical cable, but it will be appreciated that the following embodiment of the invention is applicable mutatis mutandis to other types of electrical power transmission media, some examples of which are described in this specification.

Figure 1:
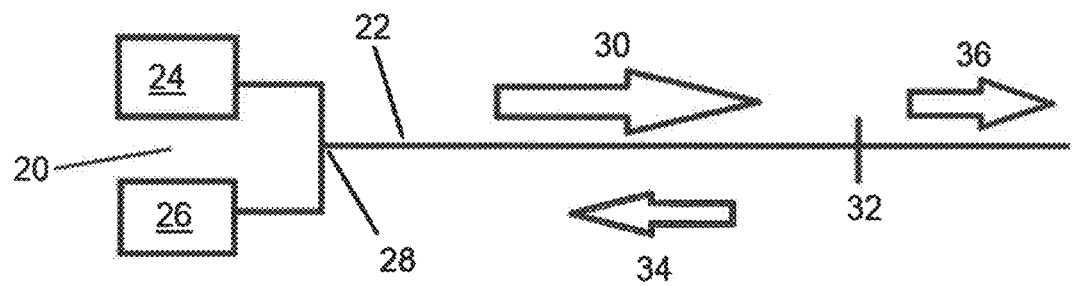
FIG. 1 shows schematically an apparatus according to an embodiment of the invention.

An apparatus according to an embodiment of the invention is shown in FIG. 1 and is designated generally by the reference numeral 20. The apparatus 20 is configured for monitoring a condition of an electrical cable 22 that is configured for electrical power transmission, as follows.

The apparatus 20 comprises a signal source 24 and a monitoring device 26. In use, each of the signal source 24 and monitoring device 26 is connected to one end 28 of the electrical cable 22, which is referred to hereon as the sending end 28.

The signal source 24 in this embodiment is configured as a voltage source. In use, the voltage source generates an electrical signal 30 that is transmitted into the sending end 28 so that the transmitted signal 30 travels along the electrical cable 22. If the characteristic impedance of the electrical cable 22 is uniform throughout its length, there would be no reflection of the transmitted signal 30. However, when there is a discontinuity 32 in characteristic impedance of the electrical cable 22, part of the transmitted signal 30 reflects off the discontinuity 32 and thereby a reflected signal 34 travels back towards the sending end 28. Meanwhile the remaining part 36 of the transmitted signal 30 continues to travel along the electrical cable 22 in the original direction. If the remaining part 36 of the transmitted signal 30 encounters another discontinuity in characteristic impedance further along the electrical cable 22, this would result in the generation of another reflected signal that travels back towards the sending end 22.

The monitoring device 26 includes an electrical sensor, which in this embodiment is a voltage sensor. When the reflected signal 34 arrives at the sending end, the voltage sensor detects the voltage amplitude of the reflected signal 34. In addition, by associating a time with the detection of the reflected signal 34, the voltage sensor detects an arrival time of the reflected signal 34 at the sending end 28. This in turn enables the monitoring device 26 to determine the overall travel time of the reflected signal 34 from the difference between the departure time of the transmitted signal 30 from the sending end 28 and the arrival time of the reflected signal 34 at the sending end 28.

It may be that multiple reflections of the transmitted signal 30 take place in the electrical cable 22, which results in detection of multiple reflected signals by the monitoring device 26.

Figure 2:
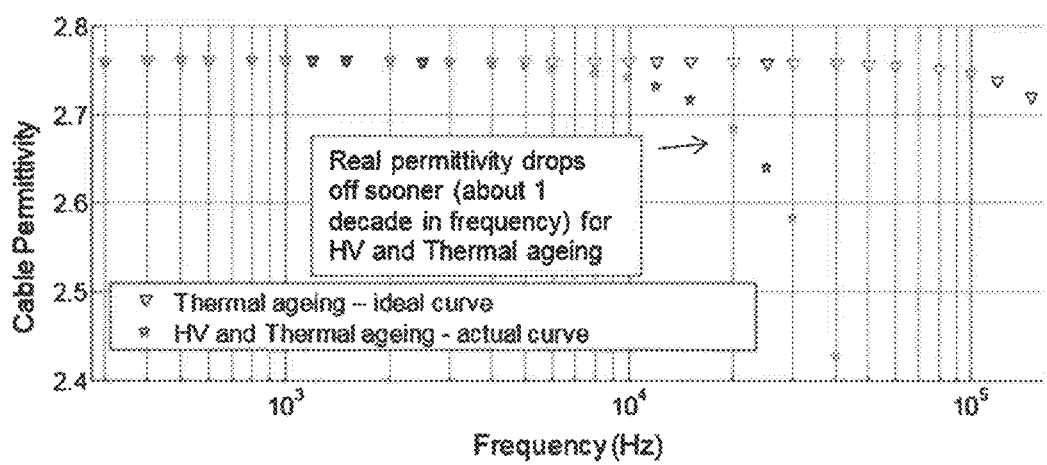
FIG. 2 shows changes in electrical cable permittivity due to ageing.

In use, the electrical cable 22 may experience ageing, such as thermal ageing and high voltage ageing. The capacitance of the electrical cable 22 reduces at higher frequencies due to ageing. This is illustrated in FIG. 2 that shows changes in electrical cable permittivity, which correspond directly to changes in electrical cable capacitance, due to ageing. In an ideal case where an exemplary electrical cable experiences thermal ageing, a drop in electrical cable permittivity takes place at a frequency of approximately 105 Hz. However, in practice, the same electrical cable experiences both thermal and high voltage ageing, which results in a drop in electrical cable permittivity at a lower frequency of roughly $10^4$ Hz in comparison to the drop in electrical cable permittivity for the ideal case. In both cases, the drops in electrical cable permittivity due to ageing takes place at relatively high frequencies.

The reduction in capacitance of the electrical cable 22 has the effect of increasing the characteristic impedance and the propagation velocity of the electrical cable 22, which in turn affects the amplitude and arrival time of the reflected signal.

Figure 3:
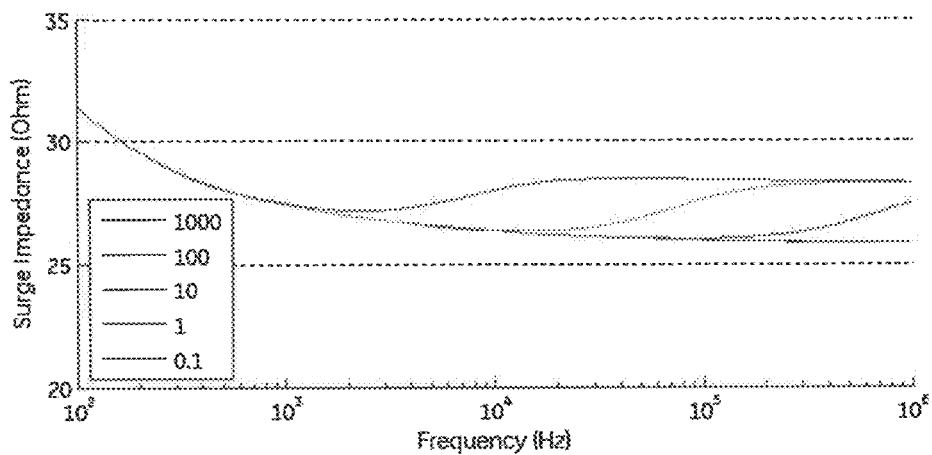
FIG. 3 shows a change in characteristic impedance of an electrical cable due to ageing.

FIG. 3 shows a change in characteristic impedance of an electrical cable 22 due to ageing, where the values of the characteristic impedance of the electrical cable 22 starts at or near the lowest most curve and move towards the highest curve due to ageing. The legend shows the values associated with each curve (1000 to 0.1) which represent the conductance (S/m) of semiconductor screen layers of the electrical cable 2.

Figure 4:
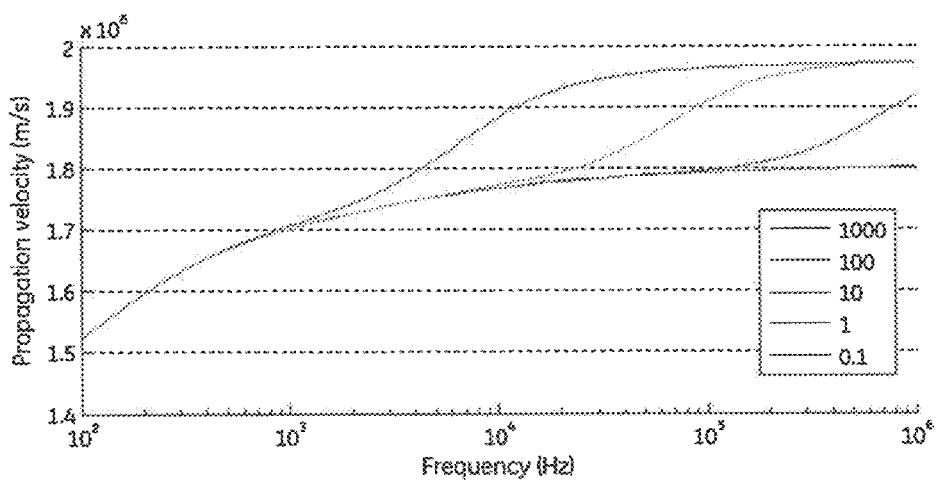
FIG. 4 shows a change in propagation velocity of an electrical cable due to ageing.

FIG. 4 shows a change in propagation velocity of an electrical cable 22 due to ageing, where the values of the propagation velocity of the electrical cable 22 starts at or near the lowest most curve and move towards the highest curve due to ageing. The legend shows the values associated with each curve (1000 to 0.1) which represent the conductance (S/m) of semiconductor screen layers of the electrical cable 22.

The inventor has found that the change in capacitance of the electrical cable 22 can be determined through use of TDR, in particular through use of the voltage amplitude and arrival time of the detected reflected signal 34.

In this embodiment, the apparatus comprises a processor to use the or each detected reflected signal to determine a change in capacitance of the electrical power transmission medium.

The use of TDR to determine the change in capacitance of the electrical cable 22 is exemplarily described as follows, with reference to FIGS. 5 to 12 which illustrate a simulation that was carried out in order to show how the change in capacitance of the electrical cable 22 is detected using TDR. The simulation was carried out in PSCAD using a MATLAB model.

Figure 5:
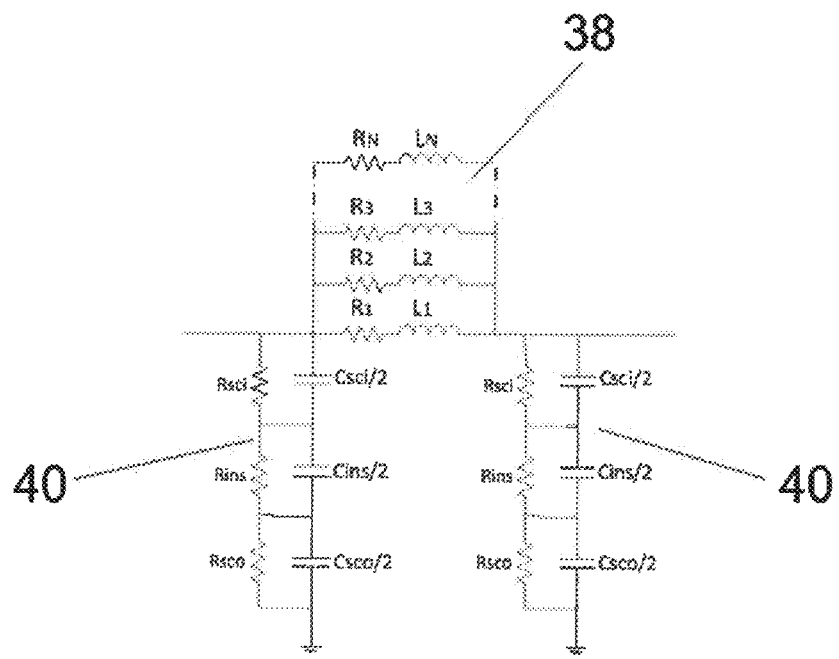
FIG. 5 shows a model of a $\pi$-section representation of an electrical cable.

The electrical cable 22 is modelled as a π-section that comprises a parallel arrangement 38 of multiple resistor-inductor series connections, where the parallel arrangement 38 is connected between a pair of shunt impedances 40. Each shunt impedance 40 includes a series connection of multiple resistor-capacitor parallel connections. FIG. 5 shows the modelled π-section with frequency dependent representations of the shunt impedances 40.

The electrical cable 22 includes an inner semiconductor screen layer, an outer semiconductor screen layer, and an intermediate cross-linked polyethylene (XLPE) insulating layer. The resistivities of the inner and outer semiconductor screen layers are typically lower than 1000 Ωm and 2000 Ωm respectively due to International Electrotechnical Commission requirements, while the resistivity of the insulating layer is usually over 1000 G Ωm. It is assumed that the semiconductor screen layers are extruded from the same material and using the same process as the insulating layer, and additives in the form of carbon nanoparticles are added to the semiconductor screen layers.

The overall change in capacitance of the electrical cable 22 due to ageing is represented by increases in the resistances Rsco,Rsci of the semiconductor screen layers. Analysis of the electrical cable impedance shows that, during ageing, the semiconductor screen layers become more resistive, which may have arisen as a result of movement or chemical change of the nanoparticles. The resistivity of the semiconductor screen layers may increase by around 3 orders of magnitude due to ageing, which is still lower than the resistivity of the insulating layer.

Figure 6:
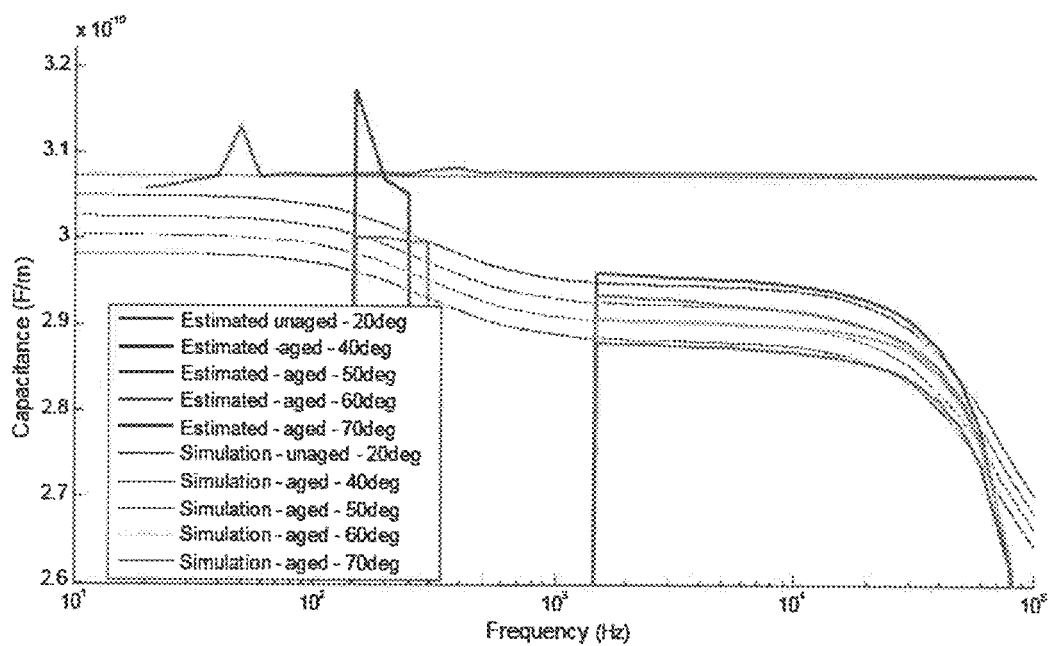
FIG. 6 shows a simulation of the apparatus of FIG. 1.

FIG. 6 shows a comparison between the estimated and simulated capacitances of an electrical cable 22. Expansion coefficients for the insulating and semiconductor screen layers have been included to enable estimation and simulation of changes in electrical cable capacitance due to ageing at different temperatures. It is shown in FIG. 6 that the estimated and simulated capacitances are sufficiently similar in value. As a result, the model is reliable for accurately simulating the change in electrical cable capacitance due to ageing.

The effectiveness of TDR in determining the change in capacitance of the electrical cable 22 is tested through use of a first model representing an un-aged electrical cable and a second model representing an aged electrical cable. For the electrical cables in both models, the series impedance remains the same (i.e. the values of the parallel arrangement of multiple resistor-inductor series connections remain the same) while the resistances Rsco,Rsci of the semiconductor screen layers are changed to simulate non-ageing and ageing to fit the estimated capacitances.

Figure 7:
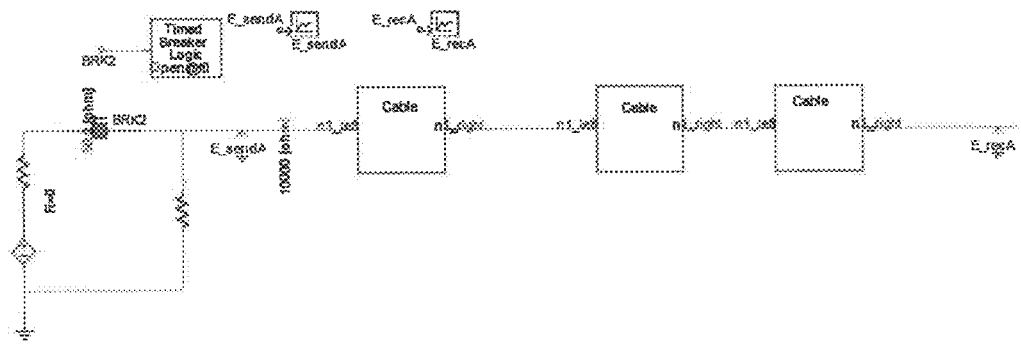
FIGS. 7 to 12 show results of the simulation of FIG. 4.

FIG. 7 illustrates the PSCAD simulation. The signal source is represented as a 50 V voltage source with a circuit breaker to control the pulse width of the signal. A standard 20 µs pulse width is used, with the circuit breaker closing at 0.02 s and re-opening again at 0.02002). Each of the square blocks labelled "Cable" represents a 50 km length of electrical cable made up of 40 π-sections, each of which includes a parallel arrangement of 50 resistor-inductor series connections. The large amount of π-sections and parallel resistor-inductor series connections is used to represent the electrical cable well from DC up to 1 MHz. Fewer resistor-capacitor parallel connections can be used for the shunt impedances as they produce a good fit over the same frequency range. In this case, each π-section includes 3 resistor-capacitor parallel connections.

Figure 8:
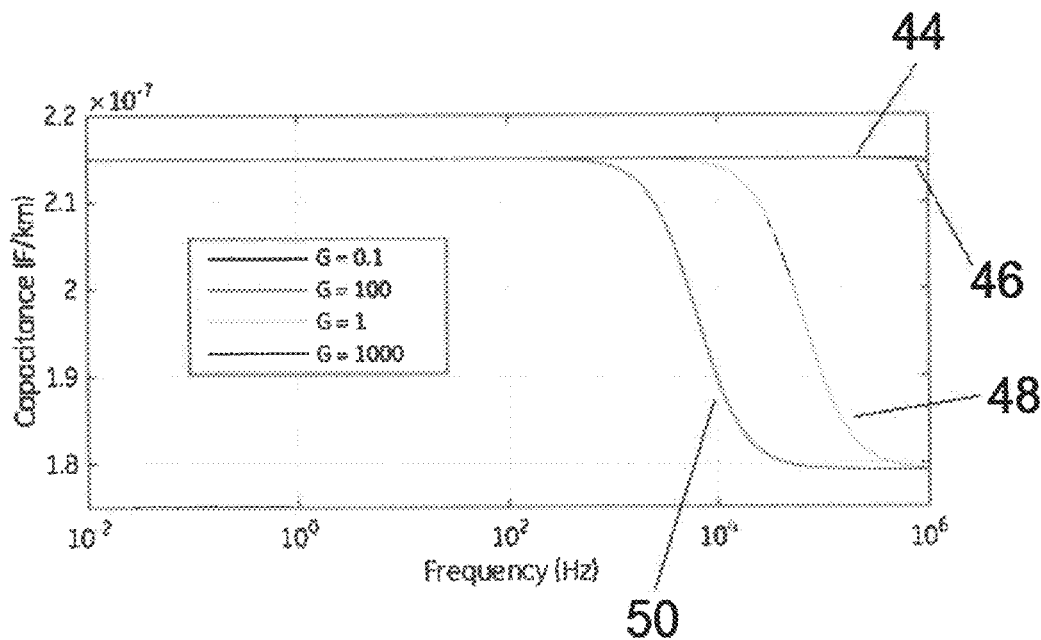

Four stages of ageing are considered, with corresponding values of electrical cable capacitance with frequency as shown in FIG. 8. The first stage 44 of ageing is based on the un-aged electrical cable, the second stage 46 of ageing is based on an electrical cable that is at the start of ageing, the third stage 48 of ageing is based on an electrical cable that has aged, and the fourth stage 50 of ageing is based on an electrical cable that has aged more than the third stage. It is shown in FIG. 8 that there is no drop in capacitance of the electrical cable 22 for the first stage 44, the drop in capacitance of the electrical cable 22 does not take place until after a frequency of 1 MHz for the second stage 46 of ageing, the drop in capacitance of the electrical cable 22 takes place at about $10^4$ Hz for the third stage 48, and the drop in capacitance of the electrical cable 22 takes place at about $10^3$ Hz for the fourth stage 50.

Figure 9:
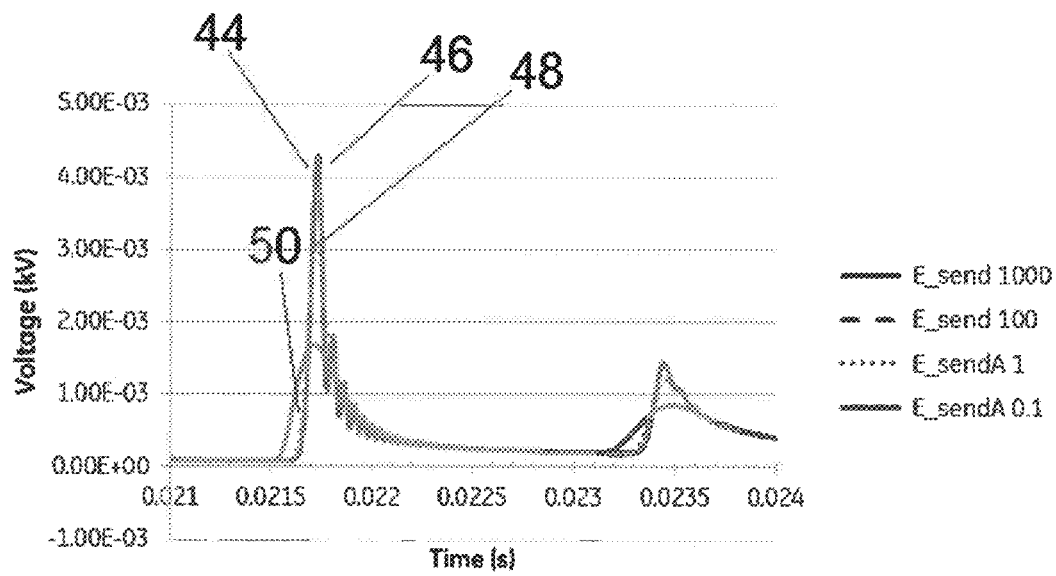
Figure 10:
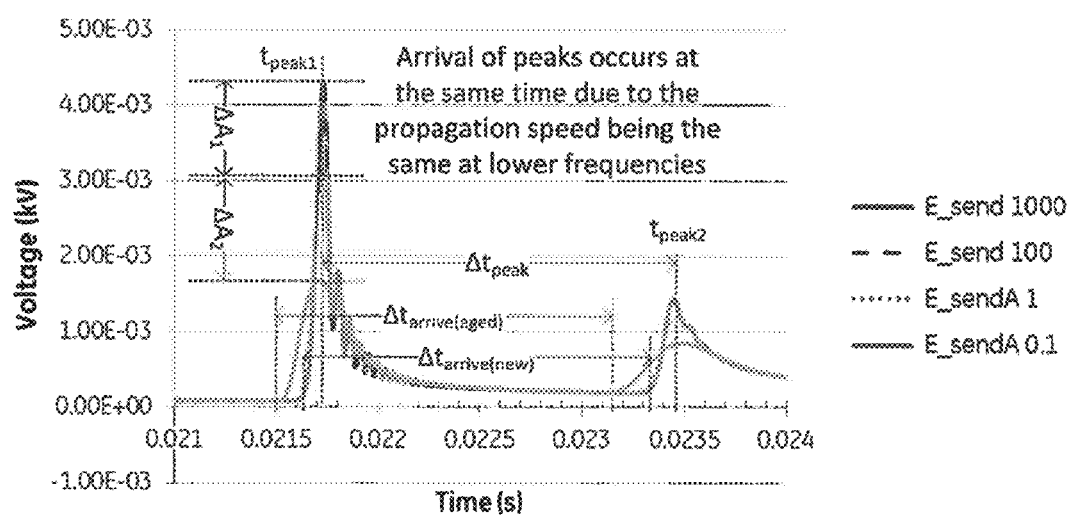

FIG. 9 shows the simulated TDR results at the sending end 28 for first and second reflected pulses, and FIG. 10 illustrates the changes in pulse amplitudes and arrival times for the same simulated TDR results. The pulse amplitudes and the arrival times of the first and second reflected pulses are similar for the first and second stages 44,46, which is expected in view of the similar values of the electrical cable capacitance with frequency for the first and second stages 44,46 as shown in FIG. 8. The pulse amplitudes of the first and second reflected pulses for the third stage 48 are lower when compared to the first and second stages 44,46, and the pulse amplitudes of the first and second reflected pulses for the fourth stage 50 are lower when compared to the first, second and third stages 44,46,48. Similarly, the arrival times of the first and second reflected pulses for the third stage 48 are earlier when compared to the first and second stages 44,46, and the pulse amplitudes of the first and second reflected pulses for the fourth stage 50 are earlier when compared to the first, second and third stages 44,46,48. These simulated TDR results are consistent with the values of the electrical cable capacitance with frequency as shown in FIG. 6. This is because the reduction in electrical cable capacitance due to ageing has the effect of increasing the characteristic impedance and propagation velocity of the electrical cable 22, which results in the reduced pulse amplitudes and the earlier arrival times of the reflected pulses.

Figure 11:
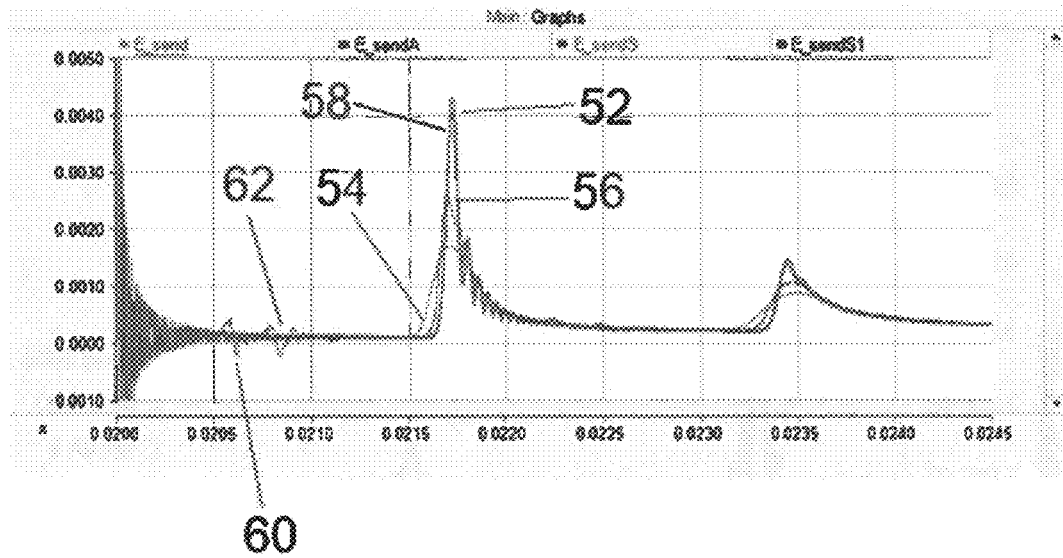

FIG. 11 shows the simulated TDR results for four electrical cables of the same type and length, but with different ageing characteristics. The length of each electrical cable is 150 km. A first electrical cable 52 is new and thereby unaged, a second electrical cable 54 is aged throughout its length, a third electrical cable 56 is aged only in its central 50 km section, and a fourth electrical cable 58 is aged in its central 6.5 km section. Uneven ageing of an electrical cable may take place due to, for example, hot spots.

It is shown in FIG. 11 that the pulse amplitudes and arrival times of the reflected pulses are different for the four electrical cables 52,54,56,58 with the different ageing characteristics.

The pulse amplitudes of the reflected pulses for the second electrical cable 54 are lower than the pulse amplitudes of the reflected pulses for the first electrical cable 52. The arrival times of the reflected pulses for the second electrical cable 54 are earlier than the arrival times of the reflected pulses for the first electrical cable 52. This is due to the first electrical cable 52 being unaged throughout its length, and the second electrical cable 54 being aged throughout its length.

The pulse amplitudes of the reflected pulses for the third electrical cable 56 are lower than the pulse amplitudes of the reflected pulses for the first electrical cable 52. The arrival times of the reflected pulses for the third electrical cable 56 are earlier than the arrival times of the reflected pulses for the first electrical cable 52. This is due to the first electrical cable 52 being unaged throughout its length, and the third electrical cable 56 being unaged throughout its length except for its central 50 km section.

The pulse amplitudes of the reflected pulses for the second electrical cable 54 are lower than the pulse amplitudes of the reflected pulses for the third electrical cable 56. The arrival times of the reflected pulses for the second electrical cable 54 are earlier than the arrival times of the reflected pulses for the third electrical cable 56. This is due to the second electrical cable 54 being aged throughout its length, and the third electrical cable 56 being unaged throughout its length except for its central 50 km section.

In addition, additional pulses 60 are observed just after the 0.0205 second mark in respect of the third electrical cable 58, which means that the apparatus 20 is capable of detecting the change in capacitance of the aged central 50 km section.

Figure 12:
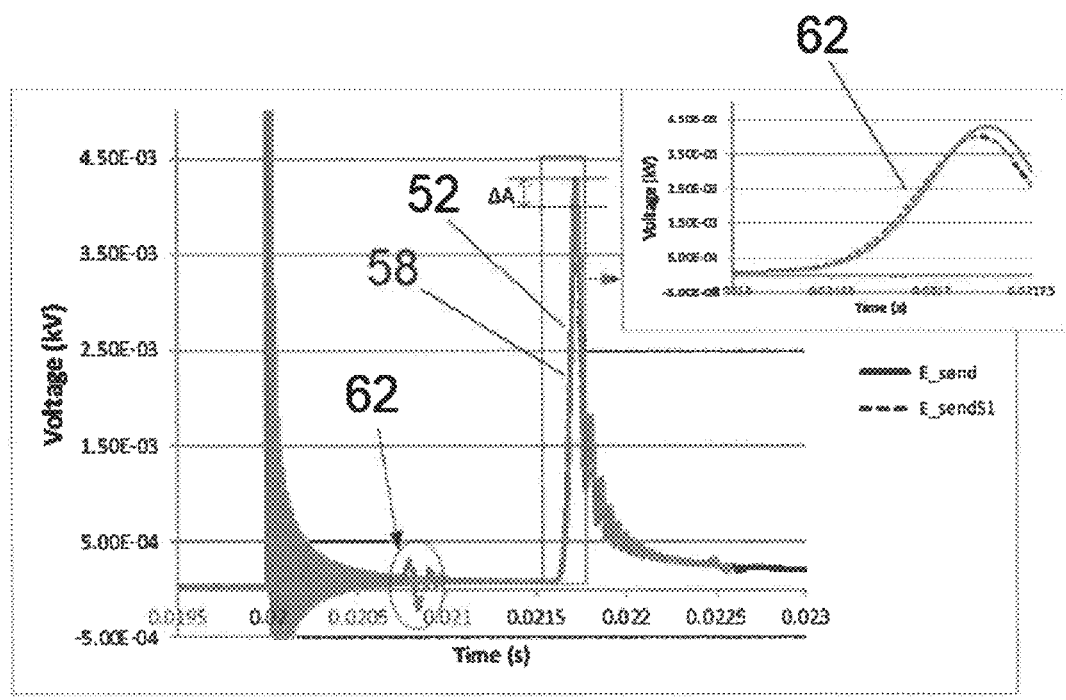

The pulse amplitudes and arrival times of the reflected pulses of the first and fourth electrical cables 52,58 are nearly identical, with the exception of additional pulses 62 just before the 0.021 second mark. A close-up of the additional pulses 62 for the fourth electrical cable is shown in FIG. 12. This is due to the first electrical cable 54 being unaged throughout its length, and the fourth electrical cable 58 being unaged throughout most of its length except for the aged central 6.5 km section. The presence of the additional pulses 62 means that the apparatus 20 is capable of detecting the change in capacitance of the relatively short central 6.5 km section, even though the central 6.5 km is significantly shorter than the electrical cable's total length of 150 km.

The simulated TDR results show that it is possible to use the apparatus 20 to perform TDR to detect the different ageing characteristics, and thereby differentiate between the different ageing characteristics, of the four electrical cables 52,54,56,58.

Further information about the change in capacitance of the electrical cable 22 can be obtained by comparing the pulse amplitudes and arrival times of the reflected pulses at different points in time (e.g. during commissioning and during ageing) in order to monitor the ageing, and therefore the change in capacitance, of the electrical cable 22 with respect to time.

The arrival times of the additional pulses 60,62 can be used to determine the location and length of the aged section of the third and fourth electrical cables 56,58. This is based on a positive pulse amplitude corresponding to an increase in characteristic impedance, and a negative pulse amplitude corresponds to a decrease in characteristic impedance. When the transmitted signal 30 first travels from the unaged section with the lower characteristic impedance to the aged section with the higher characteristic impedance, the resulting first reflected pulse has a positive pulse amplitude. When the transmitted signal 36 continues to travel from the aged section with the higher characteristic impedance to the unaged section with the lower characteristic impedance, the resulting second reflected pulse has a negative pulse amplitude. Hence, the location of the aged section along the electrical cable 22 can be identified, and furthermore the ageing along the entire length of the electrical cable 22 can be determined. The length of the aged section can be determined by comparing the arrival times of the first and second reflected pulses.

To help with the determination of a location and/or length of the aged section, the monitoring device 26 may use a reference reflected signal that is based on a known reference location in the electrical cable 22. The known reference location in the electrical cable 22 may be a joint, junction or terminal in the electrical cable 22, or any other known location of a discontinuity 32 in characteristic impedance in the electrical cable 22. By comparing the detected reflected pulses with the reference reflected signal, the monitoring device 26 is able to use more information to help determine a location and/or length of the aged section of the electrical cable 22.

The apparatus 20 of the invention therefore enables the use of TDR to obtain information about the change in capacitance of the electrical cable 22. The obtained information can be used to monitor the condition of the electrical cable 22. More specifically, the obtained information can be used as an input to determine whether the condition and the performance of the electrical cable 22 is within acceptable operating ranges, and whether any adjustments, maintenance or repair of the electrical cable 22 are required. Also, the use of TDR to monitor the change in capacitance of the electrical cable 22 is beneficial for long electrical cables, since the apparatus 20 only needs to be connected to one end 28 of the electrical cable 22.

It will be appreciated that each numerical value and property given for the embodiment shown is merely chosen to help illustrate the working of the invention, and may be replaced by another numerical value or property.

The invention claimed is:

1. An apparatus for monitoring a condition of an electrical power transmission medium, the apparatus comprising:
   a signal source for transmitting a signal to travel along the electrical power transmission medium; and
   a monitoring device configured to:
      detect reflected signals in the electrical power transmission medium,
      determine that a first arrival time of a first of the detected reflected signals indicates a reduction in arrival time compared to a second arrival time of a second of the detected reflected signals,
      determine, based on the reduction in arrival time, a change in capacitance of the electrical power transmission medium,
      identify a reference reflected signal that is set based on a reference location in the electrical power transmission medium,
      wherein the reference location in the electrical power transmission medium is a known location of a joint, a junction, or a terminal, exhibiting a discontinuity in characteristic impedance in the electrical power transmission medium, and not exhibiting an aging condition, and
      wherein the reference location is associated with detecting sections of the electrical power transmission that exhibit an aging condition,
      identify, based on a comparison of the change in capacitance to the reference reflected signal, a section of the electrical power transmission medium that corresponds to the change in capacitance and exhibits the aging condition, and
      determine, based on a comparison of the change in capacitance to the reference reflected signal, at least one of a length or a location of the section.

2. The apparatus according to claim 1 wherein the monitoring device is further configured to detect an increased characteristic impedance and an increased propagation velocity of the electrical power transmission medium based on the reduction in arrival time, and wherein to determine the change in capacitance is further based on the increased characteristic impedance and the increased propagation velocity.

3. The apparatus according to claim 1 wherein the monitoring device is further configured to detect a magnitude or amplitude of the detected reflected signals, and wherein to determine the change in capacitance of the electrical power transmission medium is further based on the magnitude or amplitude.

4. The apparatus according to claim 1 wherein the monitoring device is further configured to use the detected reflected signals to determine a location of the section of the electrical power transmission medium that corresponds to the change in capacitance of the electrical power transmission medium.

5. The apparatus according to claim 4 wherein the monitoring device is further configured to compare the detected reflected signals with the reference reflected signal to determine the location of the section of the electrical power transmission medium that corresponds to the change in capacitance of the electrical power transmission medium.

6. The apparatus according to claim 1 wherein the monitoring device is configured to use the detected reflected signals to determine the change in capacitance of the electrical power transmission medium with time.

7. The apparatus according to claim 1 wherein the electrical power transmission medium is an electrical power transmission line or cable.

8. A method for monitoring a condition of an electrical power transmission medium, the method comprising:
   transmitting a signal to travel along the electrical power transmission medium;
   detecting reflected signals in the electrical power transmission medium;
   determining that a first arrival time of a first of the detected reflected signals indicates a reduction in arrival time compared to a second arrival time of a second of the detected reflected signals;
   determining, via a monitoring device, based on the reduction in arrival time, a change in capacitance of the electrical power transmission medium,
   identifying, via the monitoring device, a reference reflected signal that is set based on a reference location in the electrical power transmission medium, and
   wherein the reference location in the electrical power transmission medium is a known location of a joint, a junction, or a terminal, exhibiting a discontinuity in characteristic impedance in the electrical power transmission medium, and not exhibiting an aging condition, and
   wherein the reference location is associated with detecting sections of the electrical power transmission that exhibit an aging condition;
   identifying, via the monitoring device, based on a comparison of the change in capacitance to the reference reflected signal, a section of the electrical power transmission medium that corresponds to the change in capacitance and exhibits the aging condition; and determining, via the monitoring device, based on a comparison of the change in capacitance to the reference reflected signal, at least one of a length or a location of the section.

9. The method according to claim 8 including detecting an increased characteristic impedance and an increased propagation velocity of the electrical power transmission medium based on the reduction in arrival time, wherein determining the change in capacitance is further based on the increased characteristic impedance and the increased propagation velocity.

10. The method according to claim 8 including detecting a magnitude or amplitude of the detected reflected signals, wherein determining the change in capacitance of the electrical power transmission medium is further based on the magnitude or amplitude.

11. The method according to claim 8 including using each detected reflected signals to determine a location of the section of the electrical power transmission medium that corresponds to the change in capacitance of the electrical power transmission medium.

12. A system for monitoring a condition of an electrical power transmission medium, the system comprising:

a voltage source for transmitting a signal to travel along the electrical power transmission medium; and at least one sensor configured to:

detect reflected signals in the electrical power transmission medium, determine that a first arrival time of a first of the detected reflected signals indicates a reduction in arrival time compared to a second arrival time of a second of the detected reflected signals, determine, based on the reduction in arrival time, a change in capacitance of the electrical power transmission medium, identify a reference reflected signal that is set based on a reference location in the electrical power transmission medium, wherein the reference location in the electrical power transmission medium is a known location of a joint, a junction, or a terminal, exhibiting a discontinuity in characteristic impedance in the electrical power transmission medium, and not exhibiting an aging condition, and wherein the reference location is associated with detecting sections of the electrical power transmission that exhibit an aging condition, identify, based on a comparison of the change in capacitance to the reference reflected signal, a section of the electrical power transmission medium that corresponds to the change in capacitance and exhibits the aging condition, and determine, based on a comparison of the change in capacitance to the reference reflected signal, at least one of a length or a location of the section.

13. The system according to claim 12 wherein the at least one sensor is further configured to detect an increased characteristic impedance and an increased propagation velocity of the electrical power transmission medium based on the reduction in arrival time, and wherein to determine the change in capacitance is further based on the increased characteristic impedance and the increased propagation velocity.

14. The system according to claim 12 wherein the at least one sensor is further configured to detect a magnitude or amplitude of the detected reflected signals, and wherein to determine the change in capacitance of the electrical power transmission medium is further based on the magnitude or amplitude.

15. The system according to claim 12 wherein the at least one sensor is further configured to use the detected reflected signals to determine a location of the section of the electrical power transmission medium that corresponds to the change in capacitance of the electrical power transmission medium.

16. The system according to claim 15 wherein the at least one sensor is further configured to compare the detected reflected signals with the reference reflected to determine the location of the section of the electrical power transmission medium that corresponds to the change in capacitance of the electrical power transmission medium.

* * * * *